(12) United States Patent
Nakamura et al.

(10) Patent No.: US 6,906,935 B2
(45) Date of Patent: Jun. 14, 2005

(54) INVERTER APPARATUS AND METHOD OF MANUFACTURING THE SAME

(75) Inventors: Masami Nakamura, Wako (JP); Atsushi Amano, Wako (JP); Iwao Shimane, Wako (JP); Yasuyuki Danjou, Wako (JP); Shigekazu Saito, Wako (JP); Toshiharu Obu, Kawasaki (JP); Nobumitsu Tada, Tachikawa (JP); Hiroki Sekiya, Kawasaki (JP)

(73) Assignees: Kabushiki Kaisha Toshiba, Tokyo (JP); Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/291,637

(22) Filed: Nov. 12, 2002

(65) Prior Publication Data

US 2003/0090915 A1 May 15, 2003

(30) Foreign Application Priority Data

Nov. 13, 2001 (JP) ......................................... 2001-347876

(51) Int. Cl.[7] .............................. H02M 1/00; H05K 7/20
(52) U.S. Cl. ......................... 363/144; 361/687; 361/688
(58) Field of Search .......................... 363/37, 144, 131, 363/132; 361/707, 688, 684, 687

(56) References Cited

U.S. PATENT DOCUMENTS 6,618,278 B2 * 9/2003 Suzuki et al. ............... 363/144

FOREIGN PATENT DOCUMENTS

| JP | 07-231071 | 8/1995 |
| JP | 2001-077260 | 3/2001 |
| JP | 2001-286156 | 10/2001 |

OTHER PUBLICATIONS

Japanese Pat. Appln. Kokai Pub. No.. 2001–177008 filed Jun. 29, 2001.
Japanese Pat. Appln. Kokai Pub. No. 2001–308470 filed Nov. 2, 2001.

* cited by examiner

*Primary Examiner*—Rajnikant B. Patel
(74) *Attorney, Agent, or Firm*—Finnegan, Henderson, Farabow, Garrett & Dunner, L.L.P.

(57) ABSTRACT

In an inverter apparatus in which a three-phase inverter main circuit having a plurality of arms comprises a plurality of semiconductor chips for electric power, one arm of the three-phase inverter main circuit includes IGBTs and diodes of semiconductor chips having a size of 10 mm by 10 mm or less with the semiconductor chips connected in parallel, while the IGBTs and the diodes are bonded to a conductor having a thickness of 1.5 mm or more and 5 mm or less, and the conductor is glued to a cooler through an insulating resin sheet containing ceramics.

12 Claims, 14 Drawing Sheets

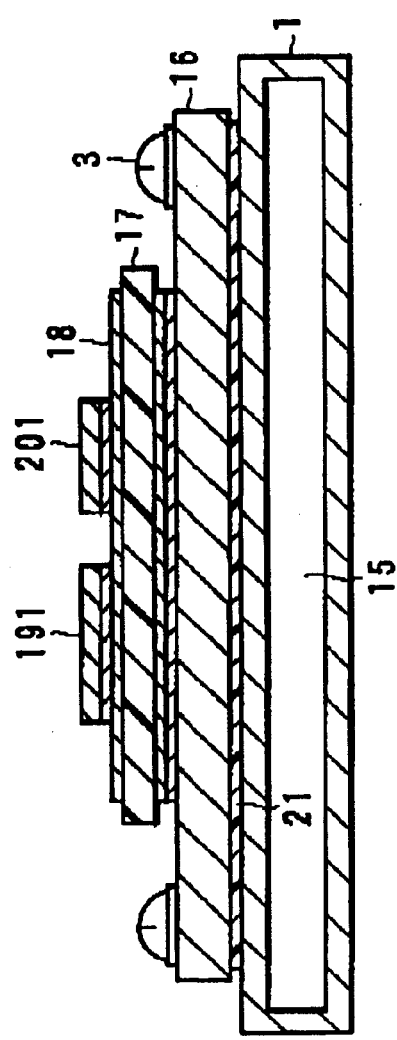
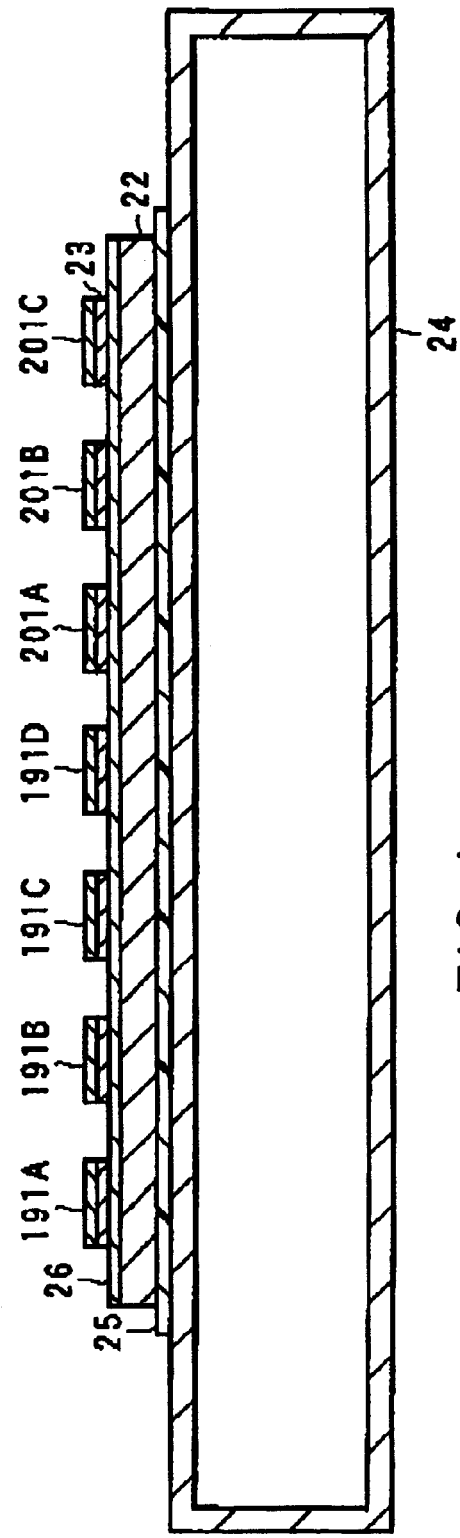
FIG.3 PRIOR ART
FIG.4

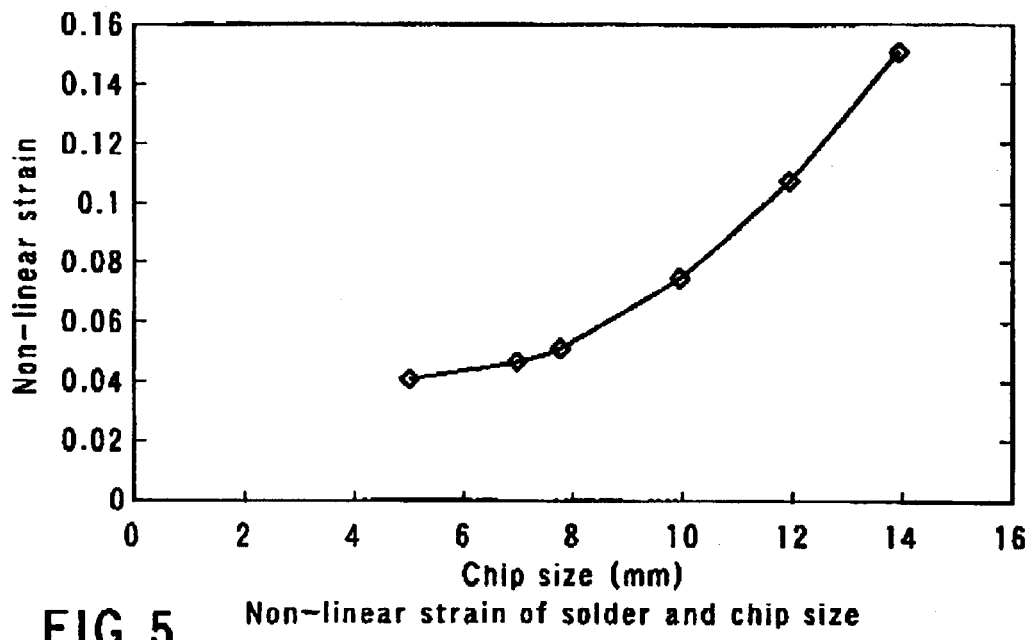
FIG.5 Non-linear strain of solder and chip size
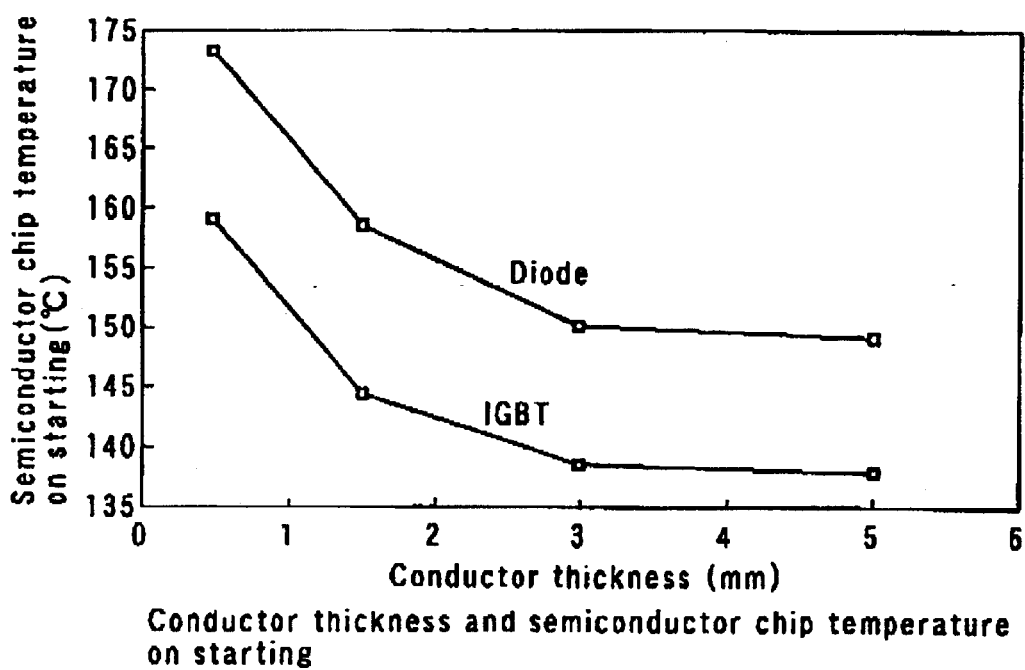
Conductor thickness and semiconductor chip temperature on starting
FIG.7

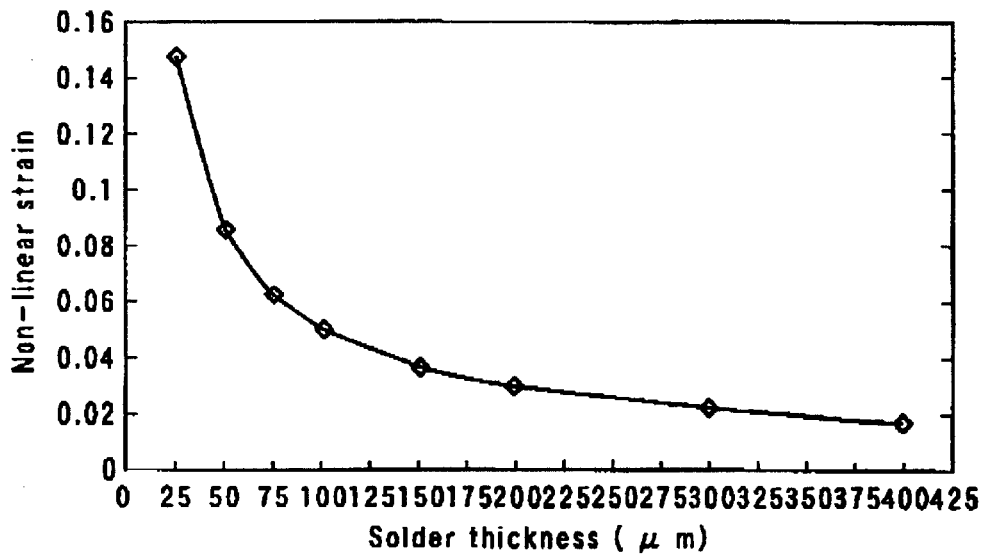
FIG.8 Solder thickness and non-linear strain
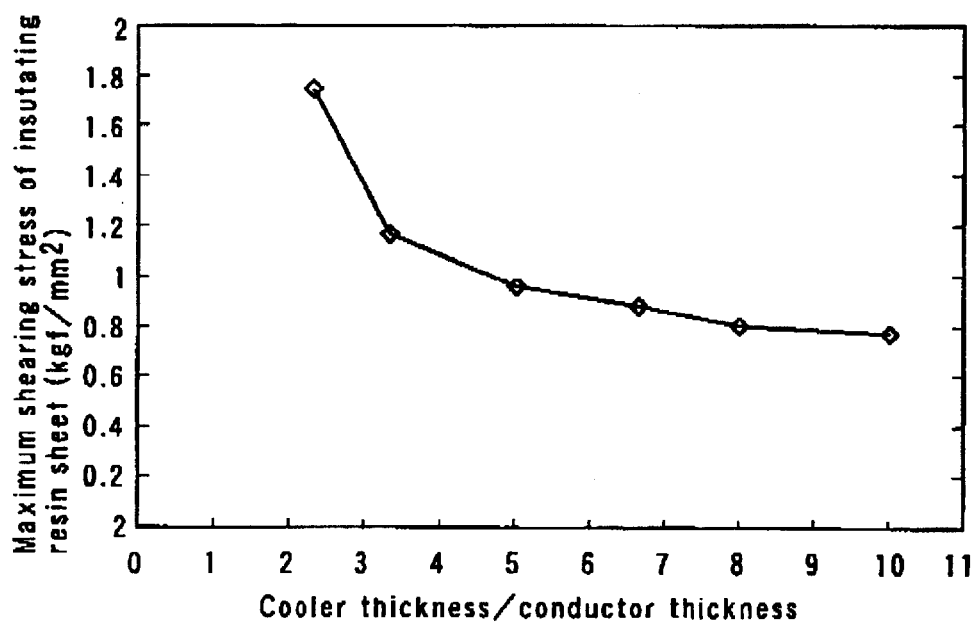
Cooler thickness/conductor thickness and shearing stress of insutating resin sheet
FIG.9

INVERTER APPARATUS AND METHOD OF MANUFACTURING THE SAME

CROSS-REFERENCE TO RELATED APPLICATIONS

This application is based upon and claims the benefit of priority from the prior Japanese Patent Application No. 2001-347876, filed Nov. 13, 2001, the entire contents of which are incorporated herein by reference.

BACKGROUND OF THE INVENTION

1. Field of the Invention

The present invention relates to an inverter apparatus in which a three-phase inverter main circuit having a plurality of arms includes a plurality of semiconductor chips for electric power and a driving circuit and a control circuit are provided, particularly relates to the small inverter apparatus having good cooling efficiency and high reliability for an electric automobile, and a method of manufacturing the same.

2. Description of the Related Art

In the electric automobile, miniaturization and the high reliability of the inverter apparatus are demanded, The inverter apparatus having the good cooling efficiency is required in order to realize the miniaturization and the high reliability of the inverter apparatus.

A structure of a conventional inverter apparatus will be described below referring to FIG. 1 to FIG. 3. FIG. 1 is a sectional plan view of the conventional inverter apparatus, FIG. 2 is a sectional side view of the conventional inverter apparatus, and FIG. 3 is a partially sectional view of an inside of the conventional inverter apparatus.

In FIG. 1 and FIG. 2, the inverter apparatus includes a semiconductor device portion 2 for electric power in which a semiconductor chip constituting a three-phase inverter main circuit is mounted, an aluminum electrolytic capacitor 4 which is a smoothing capacitor for an electric source fixed on a fixing base 5, current detectors 101 and 102 which detect current of three-phase output conductors 91 to 93, and a control unit 11, the inverter apparatus is fixed on a bottom surface of a inverter apparatus casing 1 by mounting screws 3.

The semiconductor device portion 2 and the aluminum electrolytic capacitor 4 are electrically connected by a conductor of positive side 7, a conductor of negative side 8, and connecting screws 6. An inlet 12, an outlet 13, and a channel 15 of coolant 14 are provided on the bottom surface of the inverter apparatus casing 1. The semiconductor device portion 2 is cooled by the coolant 14 which enters at the inlet 12 and flows through the channel 15, the coolant 14 goes out from the outlet 13. The coolant 14 is, for example, an anti-freeze solution.

In the semiconductor device portion 2, as shown in FIG. 3, an insulating substrate 17 is laminated and bonded to an upper portion of a metal plate for heat dissipation 16 mounted on the inverter apparatus casing 1, a metal electrode 18 is laminated and bonded to an upper portion of the insulating substrate 17, and an IGBT 191 and a diode 201 of the semiconductor chip are stacked and bonded to an upper portion of the metal electrode 18. The IGBT 191 and the diode 201, the metal electrode 18, and the insulating substrate 17 are contained by an insulative resin package, the metal plate for heat dissipation 16 is adhered to the resin package at an end portion of the metal plate for heat dissipation 16. An inside of the resin package is filled with an insulating gel.

In the semiconductor device portion 2, a thermal conductivity grease 21 is applied to a rear face of the metal plate for heat dissipation 16 in order to reduce contact thermal resistance, the semiconductor device portion 2 is fixed on the bottom surface of the inverter apparatus casing 1, in which the channel 15 is provided, by the mounting screws 3.

In the semiconductor device portion for electric power 2 having the above-described configuration, when the IGBT 191 and the diode 201 of the semiconductor chip are conducted, loss is generated. Since the insulating gel of a heat insulator is filled in upper potions of the IGBT 191 and the diode 201, almost part of the loss generated in the IGBT 191 and the diode 201 is thermally conducted to the lower metal electrode 18. The loss thermally conducted to the metal electrode 18 is thermally conducted to the metal plate for heat dissipation 16 through the insulating substrate 17. As shown in FIG. 1 to FIG. 3, the metal plate for heat dissipation 16 is pressurized and contacted by the mounting screws 3 to the bottom surface of the inverter apparatus casing 1, the loss is dissipated by the coolant 14.

In the above-described conventional inverter apparatus, there are problems as follows.

A first problem is that the thermal conductivity grease 21 is applied to the rear face of the metal plate for heat dissipation 16 in order to reduce the contact thermal resistance, the metal plate for heat dissipation 16 is pressurized and contacted to the bottom surface of the inverter apparatus casing 1 in which the channel 15 is provided by the mounting screws 3 disposed about a periphery of the semiconductor device portion 2, so that an applied pressure is not uniformly applied to the whole metal plate for heat dissipation 16.

For this reason, the contact thermal resistance between the metal plate for heat dissipation 16 and the inverter apparatus casing 1 becomes as quite large as thermal resistance of an inside of the semiconductor device portion 2, which results in the bad cooling efficiency.

In addition to the first problem, a second problem is that the thermal conductivity grease 21 applied to the rear face of the metal plate for heat dissipation 16 might deteriorate on a long-term basis, which causes reliability to be decreased.

These problems can not finally contribute to improvement of current-carrying capacity of the inverter apparatus, furthermore, the above-described problems generates another problem that the inverter apparatus increases in size as a cooler and the like increase in size and it is difficult that the reliability is not secured presupposing a long-term service of the inverter apparatus.

SUMMARY OF THE INVENTION

It is an object of the invention to provide an inverter apparatus which the current-carrying efficiency is improved by increasing the cooling efficiency in an inverter main circuit, the miniaturization is contributed, and the high reliability can be exercised and a method of manufacturing the same.

In order to achieve the above-described object, according to an aspect of the invention, there is provided an inverter apparatus in which a three-phase inverter main circuit having a plurality of arms comprises a plurality of semiconductor chips, wherein one arm of the three-phase inverter main circuit includes a plurality of semiconductor chips having a size of 2 mm by 2 mm or more and 10 mm by 10 mm or less which are connected in parallel, the plurality of semiconductor chips are connected to a conductor having a thickness of 1.5 mm or more and 5 mm or less, and the conductor is connected to a cooler through an insulating resin sheet containing ceramics.

In order to achieve the above-described object, according to another aspect of the invention, there is provided a method of manufacturing an inverter apparatus in which one arm of a three-phase inverter main circuit comprises a plurality of semiconductor chips having a size of 2 mm by 2 mm or more and 10 mm by 10 mm or less which are connected in parallel, the plurality of semiconductor chips are connected to a conductor having a thickness of 1.5 mm or more and 5 mm or less, and the conductor is connected to a cooler through an insulating resin sheet, wherein an epoxy resin sheet is used as the insulating resin sheet, the epoxy resin sheet is interposed between the conductor and the cooler, and the conductor and the cooler are pressurized and adhered with heating.

According to the inverter apparatus of the invention, the chip size is 2 mm by 2 mm or more and 10 mm by 10 mm or less arid the chips are connected in parallel, so that a value of non-linear strain of solder is small, several tens kW of current-carrying capacity required for the electric automobile can be secured.

The semiconductor chip is directly adhered to the cooler with the insulating resin sheet, so that the thermal resistance is decreased and the high reliability can be secured.

According to the method of manufacturing an inverter apparatus of the invention, after the semiconductor chip is bonded by the solder to the conductor, the epoxy resin sheet is interposed between the conductor and the cooler, and the conductor and the cooler are pressurized and adhered with heating, which allows characteristics of the epoxy resin sheet not to be deteriorated.

BRIEF DESCRIPTION OF THE DRAWINGS

FIG. 3 is a partially sectional view of an inside of a conventional semiconductor device portion for electric power and a conventional inverter apparatus;

FIG. 4 is a partially sectional view showing a mounting structure of an inverter apparatus, particularly a semiconductor chip of an inside of a semiconductor device portion for electric power according to a first embodiment of the invention;

FIG. 5 is a graph showing an analytic result of a correlation between a maximum value or non-linear strain of solder and a semiconductor chip size when a heat cycle test holding temperatures ranging from –40° C./1 hr to 125° C./1 hr is carried out on the semiconductor device portion for electric power according to the first embodiment of the invention;

FIG. 7 is a graph showing an analytic result of a correlation between a temperature and a conductor thickness of the semiconductor chip during a starting period of the inverter apparatus according to the first embodiment of the invention;

FIG. 8 is a graph showing a second embodiment of the invention, and showing an analytic result of a correlation between a maximum value of non-linear strain of solder and a solder thickness when a heat cycle test holding temperatures ranging from –40° C./1 hr to 125° C./1 hr is carried out on the semiconductor device portion for electric power according to the first embodiment of the invention;

FIG. 9 is a graph showing a third embodiment of the invention, and showing an analytic result of a correlation between a maximum shearing stress of an insulating resin sheet and a cooler thickness/conductor thickness when a heat cycle test holding temperatures ranging from –40° C./1 hr to 125° C./1 hr is carried out on the semiconductor device portion for electric power according to the first embodiment of the invention;

DETAILED DESCRIPTION OF THE INVENTION

Figure 1:
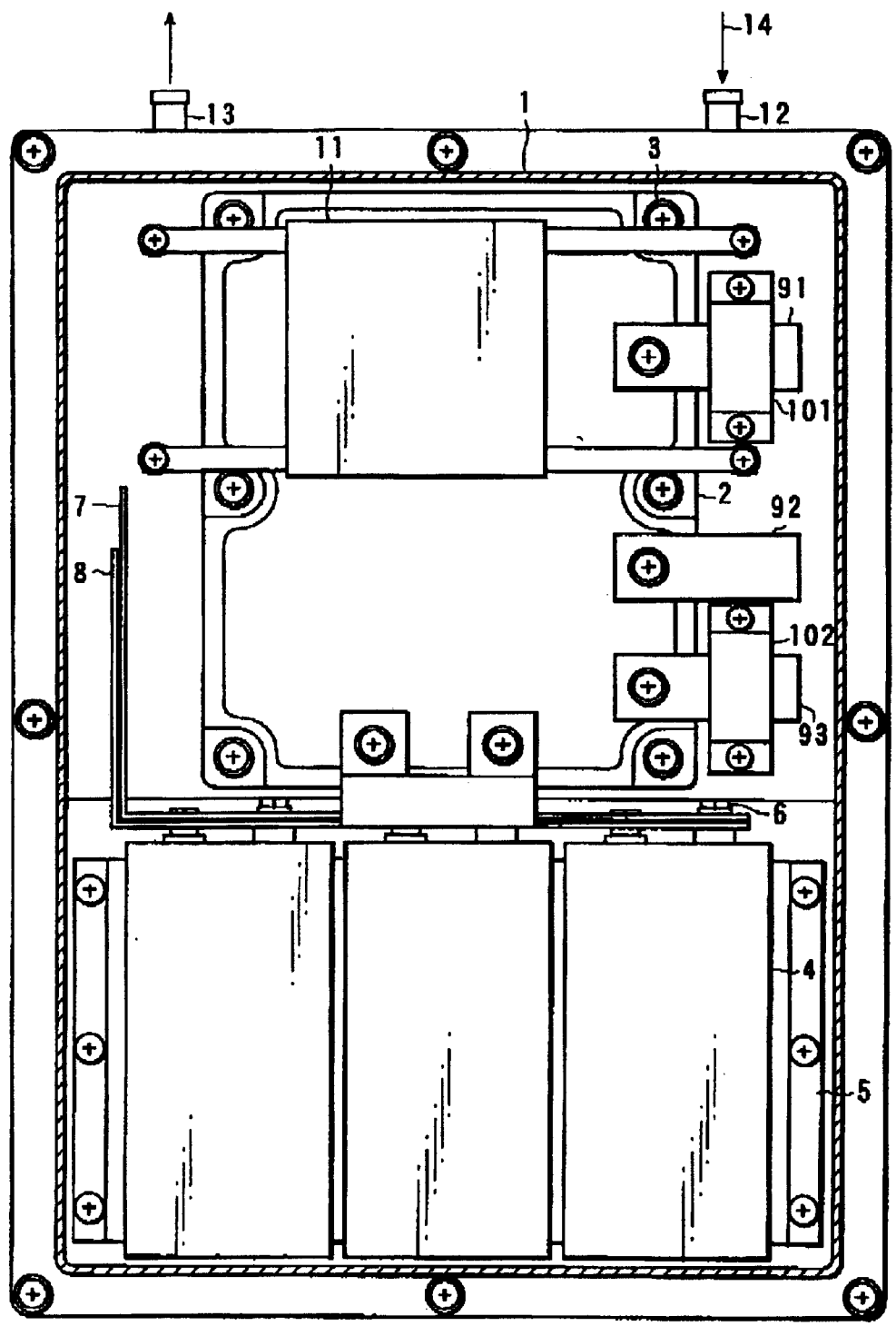
FIG. 1 is a sectional plan view of a conventional inverter apparatus.

Embodiments of the invention will be described below referring to the drawings.

(First Embodiment)

A first embodiment of the invention will be described referring to FIG. 4 to FIG. 7.

In FIG. 4, the semiconductor device portion for electric power in the inverter apparatus constitutes a three-phase inverter main circuit, one arm of the three-phase inverter main circuit includes IGBTs 191A, 191B, 191C, and 191D of a semiconductor chip having size of 10 mm by 10 mm or less and diodes 201A, 201B, and 201C having size of 10 mm or less, the IGBTs 191A, 191B, 191C, and 191D and the diodes 201A, 201B, and 201C are connected in parallel.

FIG. 4 shows the embodiment in case that the IGBT is four parallels and the diode is three parallels. The IGBTs 191A, 191B, 191C, and 191D of a semiconductor chip and diodes 201A, 201B, and 201C are disposed on a conductor 22 made of copper having a thickness of 1.5 mm or more and 5 mm or less, while IGBTs and diodes are dispersed each other with a distance no less than a double thickness of the conductor 22. The conductor 22 and IGBTs 191A, 191B, 191C, and 191D and diodes 201A, 201B, and 201C are bonded by a bonding material of a low-melting solder such as Sn/Pb or a high-melting solder such as Sn/Ag/Cu. The conductor 22 is further glued to a cooler 24 made of copper or aluminum with an insulating resin sheet 25 containing ceramics.

The insulating resin sheet 25 is, for example, a sheet in which epoxy resin is filled with a ceramic filler such as boron nitride, thermal conductivity of the insulating resin sheet 25 is in the range from 2 to 4 W/mK and a thickness of the insulating resin sheet 25 is in the range from about 0.1 to about 0.15 mm.

In the conductor 22, plating treatment 26 is carried out on a surface on which the IGBTs 191A to 191D and the diodes 201A to 201C are bonded. In the conductor 22, plating treatment is not carried out on a reverse surface on which the cooler 24 is adhered by the insulating resin sheet 25 containing ceramics.

Since the IGBT 191 and the diode 201 are made of silicon and the conductor 22 is made of copper, when the heat cycle is loaded, difference in coefficient of linear expansion between the IGBT 191 and the diode 201 and the conductor 22 causes generation of shear stress and non-linear strain in the solder 23. When heat cycle is loaded, larger value of non-linear strain causes generation of crack in solder. A smaller value of non-linear strain increases reliability and durability.

In case that the heat cycle is loaded on the semiconductor device portion for electric power in the inverter apparatus of the embodiment, the shear stress is generated in the solder 23 and the non-linear strain is generated. This is because the IGBT 191 and the diode 201 are made of silicon and the conductor 22 is made of copper, so that the coefficients of linear expansion of the IGBT 191 and the diode 201 and the conductor 22 are different.

FIG. 5 is the analytic result of the correlation between the maximum value of non-linear strain of the solder 23 as a bonding material and the chip size when the heat cycle test holding temperatures ranging from −40° C./1 hr to 125° C./1 hr is carried out on the semiconductor device portion for electric power according to the first embodiment of the invention.

According to FIG. 5, it is recognized that there is a remarkable difference in non-linear strain of solder bordered on the chip size in 10 mm by 10 mm.

Figure 2:
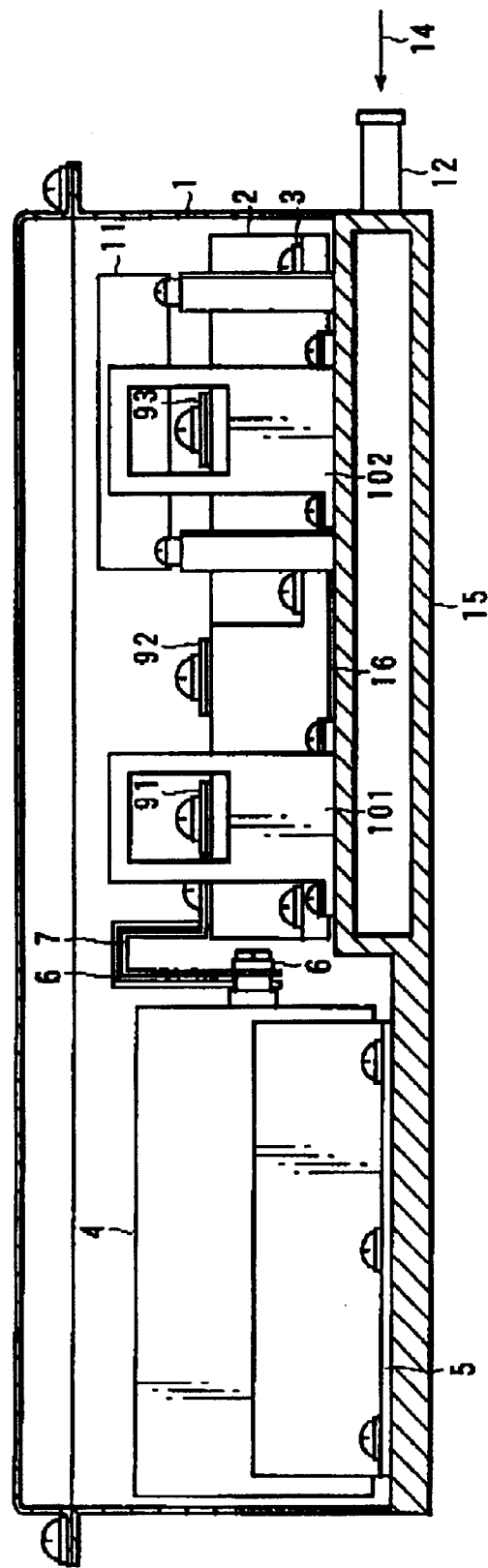
FIG. 2 is a sectional side view of a conventional inverter apparatus.

That is to say, when the chip size exceeds 10 mm by 10 mm, it is found that the non-linear strain of the solder is increased. Therefore, when the upper limitation of the chip size in 10 mm by 10 mm, it is found that the reliability and the durability of the inverter apparatus can be secured. On the other hand, when the lower limitation of the chip size ranging from 5 mm by 5 mm showed in FIG. 5 to 2 mm by 2 mm inspected by inventors, it is found that the reliability and the durability of the inverter apparatus can be secured.

The current-carrying capacity per one chip is decreased when the chip size in 10 mm by 10 mm or less similarly to the embodiment. In this case, several tens kW of current-carrying capacity required for the electric automobile can be secured by connecting the chips in parallel.

In the inverter apparatus having a configuration shown in FIG. 4, the IGBTs 191A to 191D and the diodes 201A to 201C bonded to the conductor 22 are directly adhered to the cooler 24 by using the insulating resin sheet 25, so that the contact thermal resistance at a contact portion to the cooler like the conventional semiconductor device portion for electric power shown in FIG. 3 is eliminated, the thermal resistance is decreased.

Furthermore, the insulating resin sheet 25 has low thermal conductivity, compared with the conventional insulating substrate 17, for example, alumina substrate (thermal conductivity is 21 W/mK and thickness is 0.32 mm), the conductor 22 on the insulating resin sheet 25 is made of copper whose thermal conductivity is good, a thickness of the conductor 22 is 1.5 mm or more and 5 mm or less, and the IGBTs 191A to 191D and the diodes 201A to 201C are disposed on the conductor 22 while the IGBT 191 and the diode 201 are dispersed on the conductor 22. Accordingly, heat generated in the IGBTs 191A to 191D and the diodes 201A to 201C is diffused by heat conduction of the conductor 22 and absorbed by heat capacity of the conductor 22. This permits the thermal resistance to be further decreased in the semiconductor device portion for electric power of the embodiment.

Figure 6:
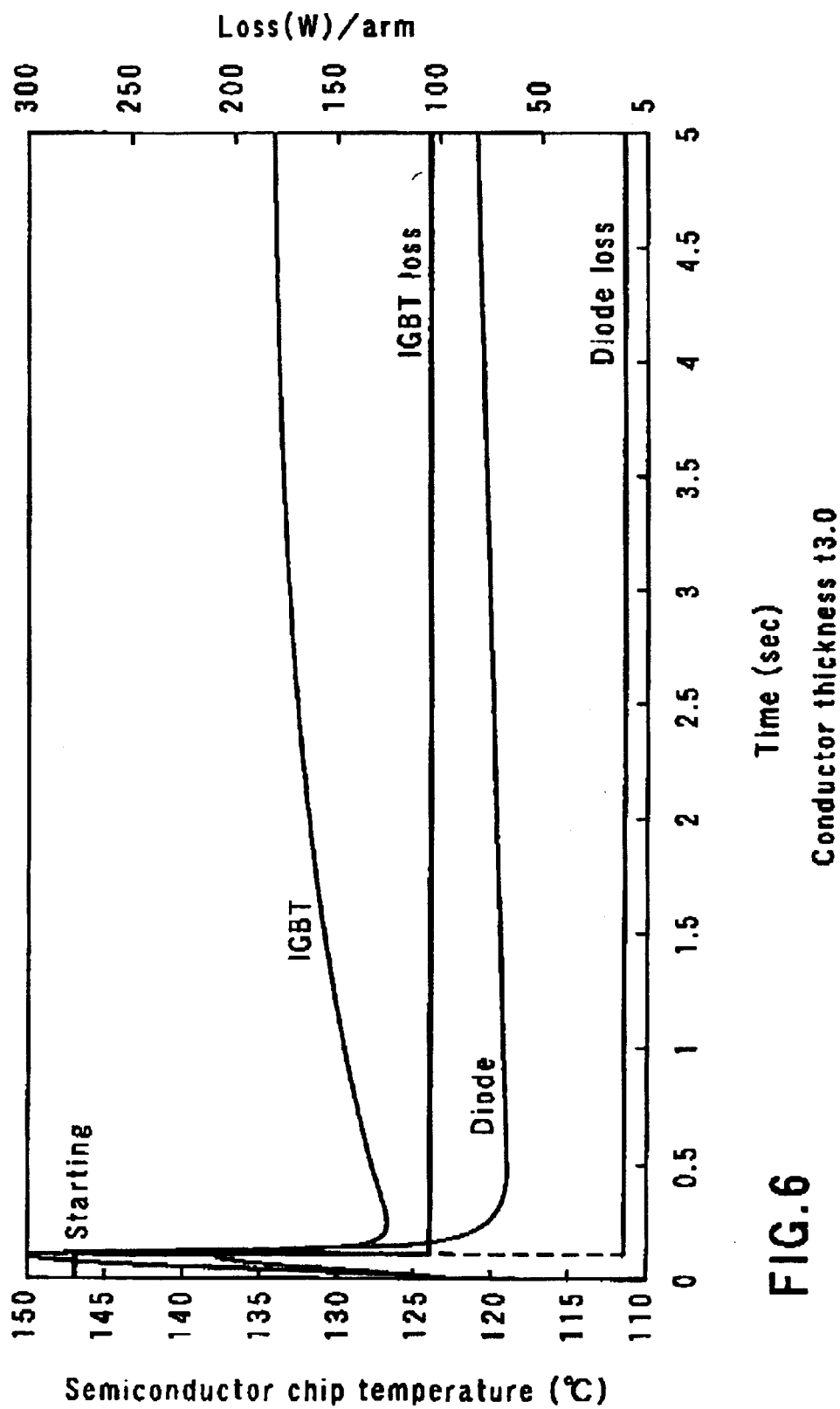
FIG. 6 is a graph showing an analytic result of a temperature of the semiconductor chip during a conducting period of the inverter apparatus according to the first embodiment of the invention.

FIG. 6 is the analytic result of a temperature change of the IGBT 191 and the diode 201 during the conducting period of the inverter apparatus when the thickness of the conductor 22 is 3 mm. In the starting period of the inverter apparatus, IGBT loss and diode loss become large, and temperature rise of both the IGBT and the diode particularly becomes large.

It is important to decrease the temperature rise of the IGBT and the diode particularly during the starting period of the inverter apparatus in order to improve the reliability of the IGBT 191 and the diode 201, reduce the number of parallel, and miniaturize the semiconductor device portion for electric power and the inverter apparatus.

FIG. 7 is a temperature change of the IGBT 191 and the diode 201 during the starting period of the inverter apparatus when the thickness of the conductor 22 is used as a parameter. When the thickness of the conductor 22 is 1.5 mm or less, the temperatures of the IGBT 191 and the diode 201 are particularly increased. The temperatures of the IGBT and the diode is are not largely decreased, even though the thickness of the conductor 22 is more than 5 mm. When the thickness of the conductor 22 is 1.5 mm or more and 5 mm or less, the temperatures of the IGBT and the diode during the starting period of the inverter apparatus are decreased by an effect of the heat capacity of the conductor 22.

When the thickness of the conductor 22 is 3 mm, in the semiconductor device portion for electric power of the invention, steady heat resistance per IGBT chip is 0.46 K/W for the IGBT chip size of 7.8 mm by 7.8 mm, the steady heat resistance per IGBT chip is decreased to an almost half value, compared with the conventional semiconductor device portion for electric power having the steady heat resistance per IGBT chip of 1.11 K/W.

In the insulating resin sheet 25, adhesiveness to a more active surface such as a copper surface is stronger than the adhesiveness to an inactive surface, for example, a Ni plated surface. On the contrary, in wire bonding which is electric wire of the IGBT and the diode, the adhesiveness to a plated surface is stronger than the adhesiveness to the active surface.

Accordingly, in the conductor 22 of the embodiment, since the surface bonded to the IGBTs 191A to 191D and the diodes 201A to 201C is carried out by the plating treatment 26, bonding strength between the wire bonding and the conductor 22 is increased. The plating treatment is not carried out on the reverse of the conductor 22, which 1s adhered to the cooler 24 by the insulating resin sheet 25 containing ceramics, so that the bonding strength between the conductor 22 and the insulating resin sheet 25 is increased.

As described above, in the inverter apparatus of the embodiment shown in FIG. 4 to FIG. 7, the heat resistance of the semiconductor chip caused by the IGBT and the diode is decreased halt inside the semiconductor device portion for electric power 2, the cooling efficiency is increased, the reliability of the inverter apparatus 1s improved, and the miniaturization of the inverter apparatus is realized. Furthermore, since the thermal conductive grease which might deteriorate on a long-term basis, the reliability and the durability are improved.

(Second Embodiment)

A second embodiment of the invention will be described below referring to FIG. 4 and FIG. 8.

The second embodiment defines a solder thickness in the semiconductor device portion for electric power of the first embodiment.

In FIG. 4, in the inverter apparatus, the semiconductor chips of the IGBTs 191A, 191B, 191C, and 191D and the diodes 201A, 201B, and 201C are bonded to the copper conductor 22 having a thickness of 1.5 mm or more and 5 mm or less by the solder 23 of the low-melting solder such as Sn/Pb or the high-melting solder such as Sn/Ag/Cu.

When the heat cycle is loaded on the semiconductor device portion for electric power, the shear stress is generated in the solder 23, the non-linear strain is generated. This is because the IGBT 191 and the diode 201 are made of silicon and the conductor 22 is made of copper, so that the coefficients of linear expansion of the IGBT 191 and the diode 201 and the conductor 22 are different. The lower is a value of the non-linear strain, the more the reliability and the durability are improved.

FIG. 8 is the analytic result of the correlation between the maximum value of non-linear strain of the solder and the solder thickness when the heat cycle test holding temperatures ranging from −40° C./1 hr to 125° C./1 hr is carried out on the semiconductor device portion for electric power shown in FIG. 4 to FIG. 7.

When the thickness of the solder 23 is lower than 75 μm, the non-linear strain is increased. When the thickness of the solder 23 is 75 μm or more, the non-linear strain is decreased, because, by increasing the thickness of the solder 23, thermal stress of the solder is dispersed to decrease stress concentration. The non-linear strain is not largely decreased even though the thickness of the solder 23 is 300 μm or less.

As described above, in the embodiment, the thickness of the solder 23 which bonds the IGBT 191 and the diode 201 to the conductor 22 having the thickness of 1.5 mm or more and 5 mm or less is 75 μm or more and 300 μm or less, consequently, the non-linear strain of the solder 23 can be decreased, and the reliability and the durability of the semiconductor device portion for electric power and the inverter apparatus shown in FIG. 4 to FIG. 7 can be further improved.

(Third Embodiment)

A third embodiment of the invention will be described below referring to FIG. 4 and FIG. 9.

The third embodiment defines a thickness of the cooler 24 in the semiconductor device portion for electric power of the first embodiment.

FIG. 9 is an analytic result of a correlation between a maximum shearing stress of an insulating resin sheet and a cooler thickness/conductor thickness when a heat cycle test holding temperatures ranging from −40° C./1 hr to 125° C./1 hr is carried out on the semiconductor device portion for electric power shown in FIG. 4 to FIG. 7.

In FIG. 4, the copper conductor 22 is adhered to the cooler 24 made of copper or aluminum by the insulating resin sheet 25 containing ceramics. Though it is thought that a material of the cooler 24 is copper, aluminum or the like, aluminum is desirable in consideration of productivity, workability, and weight.

When the cooler 24 is made of aluminum and the heat cycle is loaded on the semiconductor device portion for electric power, the shear stress is generated in the insulating resin sheet by difference in coefficient of linear expansion between the conductor 22 made of copper and the cooler 24 made of aluminum. When a value of the shear stress becomes larger, the insulating resin sheet 25 is peeled. The smaller is the value of the shear stress, the more the reliability and the durability are improved.

FIG. 9 is the analytic result of the correlation between the maximum shearing stress of an insulating resin sheet and the cooler thickness/conductor thickness when the cooler 24 is made of aluminum and the heat cycle test holding temperatures ranging from −40° C./1 hr to 125° C./1 hr is carried out on the semiconductor device portion for electric power shown in FIG. 4 to FIG. 7.

When the ratio of cooler 24 thickness/conductor 22 thickness is lower than 3.3, the maximum shear stress of the insulating resin sheet 25 is increased. When the ratio of cooler 24 thickness/conductor 22 thickness is 3.3 or more, rigidity or the cooler 24 becomes sufficiently large compared with the conductor 22, and deformation of the cooler 24 is restrained, which allows the deformation of the insulating resin sheet 25 to be restrained, so that the maximum shear stress of the insulating resin sheet 25 is decreased. The maximum shear stress is not almost decreased, even though the ratio of cooler 24 thickness/conductor 22 thickness is 10 or more.

According to the embodiment, the ratio of the thickness of the cooler 24 to the thickness of the conductor 22 having a thickness of 1.5 mm or more and 5 mm or less is 3.3 or more and 10 or less, consequently, the maximum shear stress of the insulating resin sheet 25 can be decreased, and the reliability and the durability of the semiconductor device portion for electric power and the inverter apparatus of the first and second embodiments of the invention can be further improved.

(Fourth Embodiment)

A fourth embodiment of the invention will be described below referring to FIG. 10 to FIG. 13.

Figure 10:
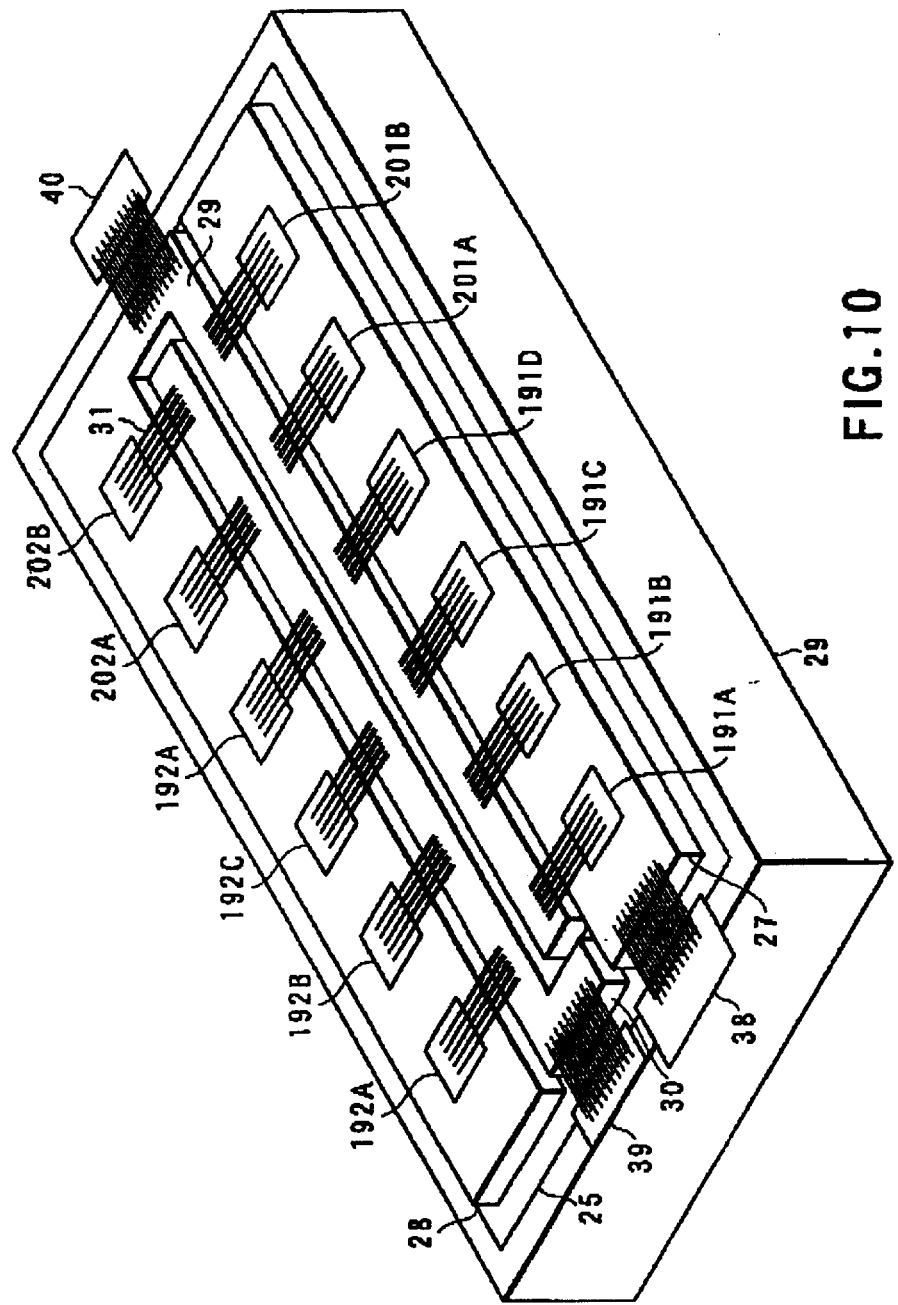
FIG. 10 is a partially perspective view of a semiconductor device portion for electric power in an inverter apparatus according to a fourth embodiment of the invention.

FIG. 10 is a partially perspective view of a semiconductor device portion for electric power in an inverter apparatus according to a fourth embodiment of the invention. In the embodiment, the IGBT per one arm is four parallels and the diode per one arm is two parallels.

Figure 11:
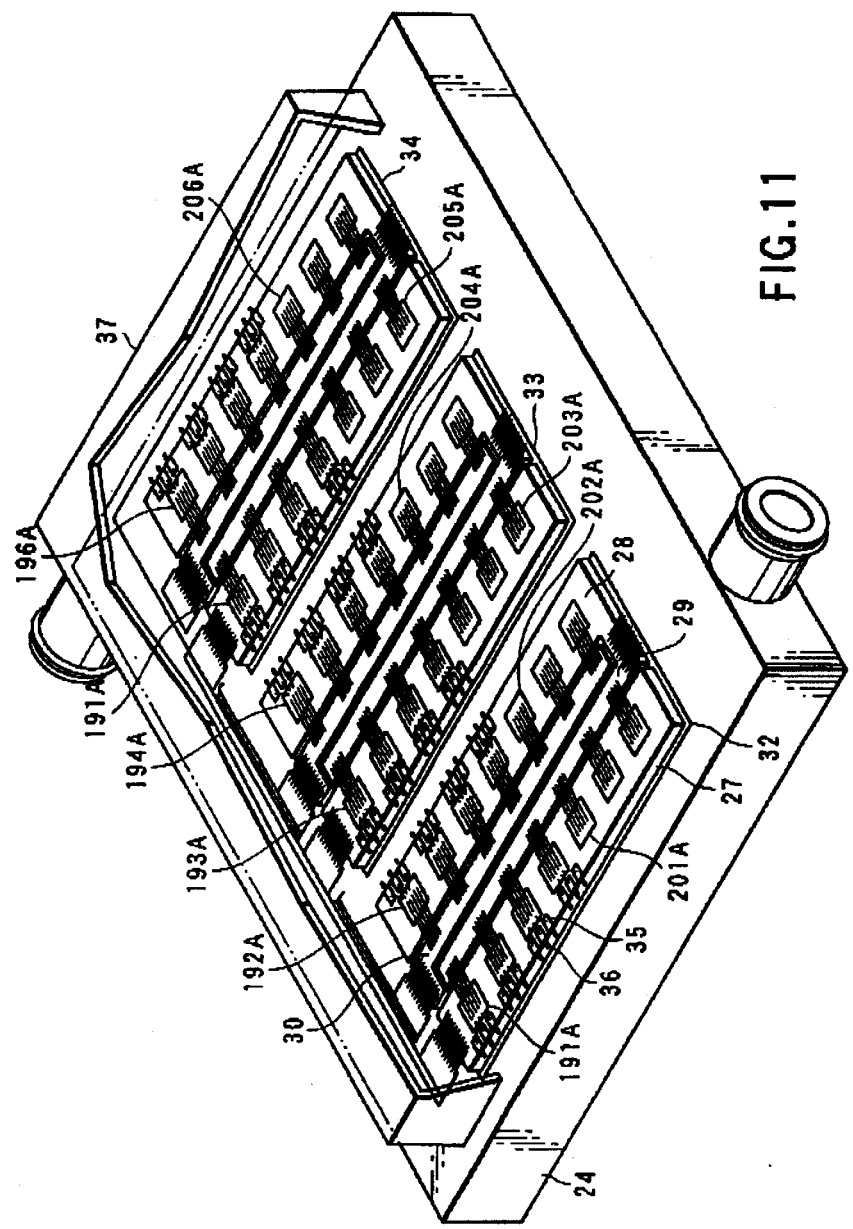
FIG. 11 is a perspective view illustrating an inside structure of the semiconductor device portion for electric power in the inverter apparatus according to the fourth embodiment of the invention.

FIG. 11 is a perspective view illustrating an inside structure of the semiconductor device portion for electric power in the inverter apparatus according to the fourth embodiment of the invention. In the embodiment, the IGBT per one arm is four parallels and the diode per one arm is two parallels.

Figure 12A:
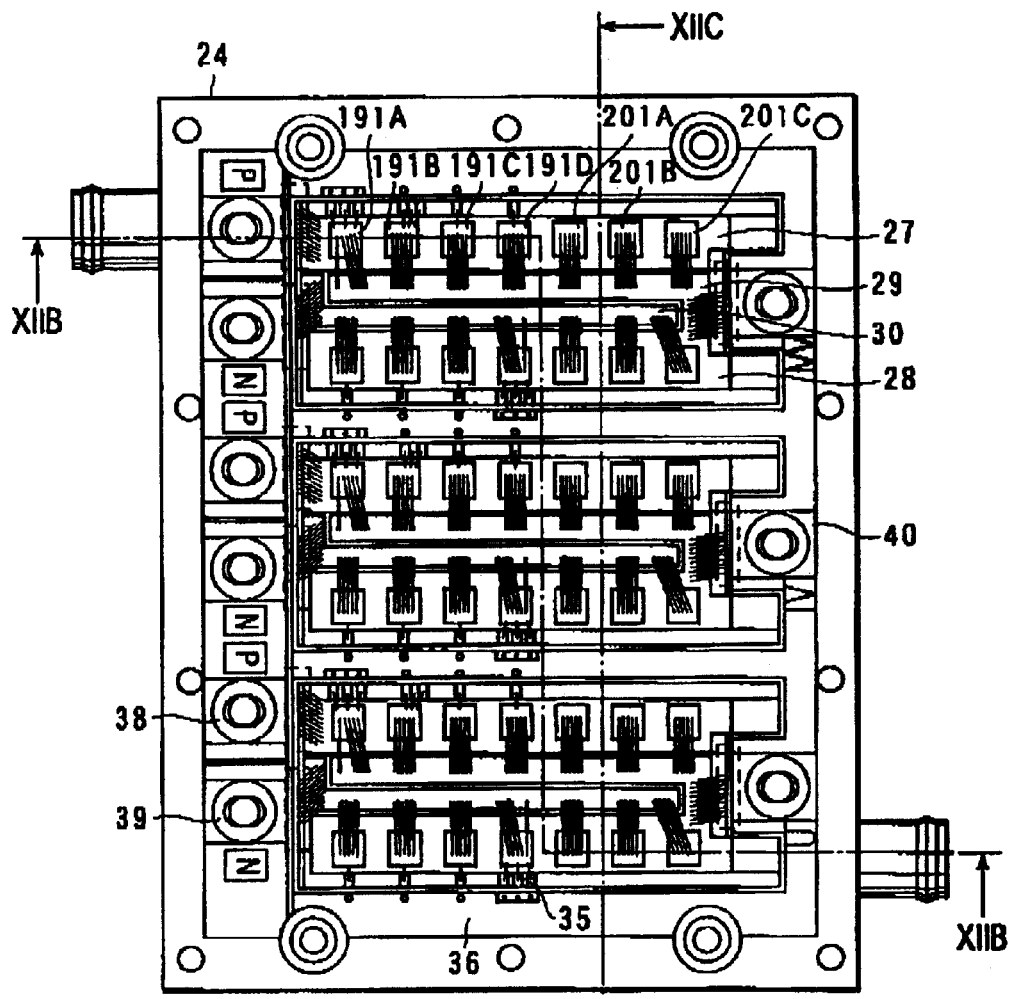
FIG. 12A to FIG. 12C shows the semiconductor device portion for electric power in the inverter apparatus according to the fourth embodiment of the invention.
Figure 12B:
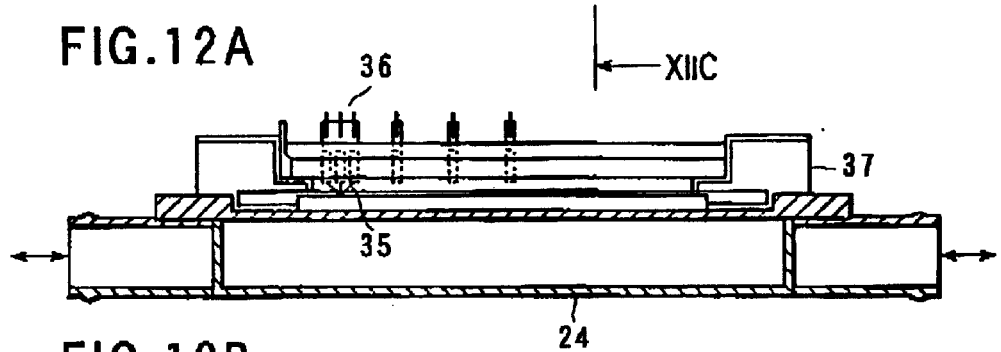
Figure 12C:
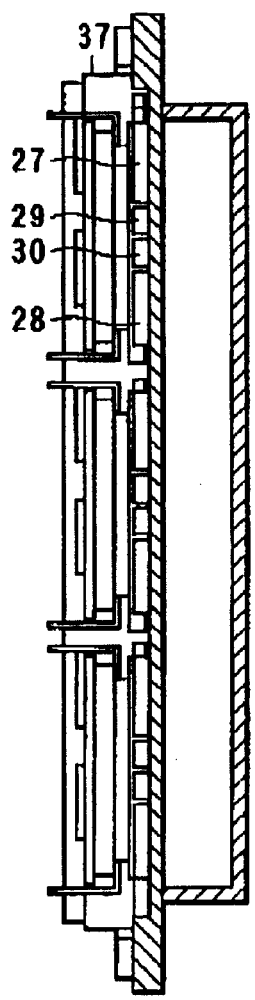

FIG. 12A to FIG. 12C shows the semiconductor device portion for electric power in the inverter apparatus according to the fourth embodiment of the invention, FIG. 12A is a plan view, FIG. 12B is a sectional view taken along the line XII-B—XII-B of FIG. 12A, FIG. 12C is a sectional view taken along the line XII-C—XII-C of FIG. 12A. In the embodiment, the IGBT per one arm is four parallels and the diode per one arm is three parallels.

Figure 13:
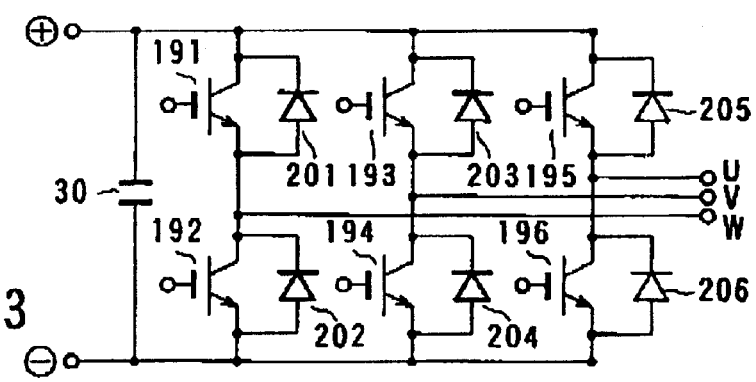
FIG. 13 is a circuit diagram of the inverter apparatus according to the first embodiment of the invention.

FIG. 13 is a circuit diagram of the inverter apparatus according to the fourth embodiment of the invention.

In FIG. 10, in the semiconductor device portion for electric power, the IGBTs 191A to 191D connected in four parallels and the diodes 201A and 201B connected in two parallels, which constitute an upper side arm of a W-phase of a three-phase inverter main circuit shown in FIG. 10, are arranged in one line on an upper side arm conductor 27 which constitute the upper side arm of the three-phase inverter main circuit. In the same way, IGBTs 192A to 192D connected in four parallels and diodes 202A and 202B connected in two parallels, which constitute an lower side arm of the W-phase of the three-phase inverter main circuit, are arranged in one line on an lower side arm conductor 28 which constitute is the lower side arm of the three-phase inverter main circuit.

A three-phase output conductor 29, which connects a three-phase output terminal 40 to the IGBTs 191A to 191D and the diodes 201A and 201B arranged on the upper side arm conductor 27, is arranged between the upper side arm conductor 27 and the lower side arm conductor 28.

In the embodiment shown in FIG. 10 to FIG. 13, the lower side arm conductor 28 and the three-phase output conductor 29 are formed by the same conductor. A negative electrode conductor 30, which connects a negative electrode terminal 39 to the IGBTs 192A to 192D and the diodes 202A and 202B arranged on the lower side arm conductor 28, is arranged between the upper side arm conductor 27 and the lower side arm conductor 28. The IGBTs and the diodes and each conductor are electrically connected by wire bonding 31.

In case of the above-described arrangement, an individual current path, which is connected in parallel from a positive electrode terminal 38 to the three-phase output terminal 40 through each of the IGBTs 191A to 191D, becomes uniform. In the same way, an individual current path, which is connected in parallel from the three-phase output terminal 40 to the negative electrode terminal 39 through each of the IGBTs 192A to 192D, becomes uniform. In the same way, an individual current path, which is connected in parallel from the three-phase output terminal 40 to the positive electrode terminal 38 through each of the diodes 201A and 201B, becomes uniform.

In the same way, an individual current path, which is connected in parallel from the negative electrode terminal 39 to the three-phase output terminal 40 through each of the diodes 202A and 202B, becomes uniform. Other configurations are the same as the first to third embodiments.

In FIG. 11 and FIG. 12A to FIG. 12C, in the semiconductor device portion for electric power, the insulating resin sheet containing ceramics is divided by each phase of the three-phase inverter main circuit, a W-phase insulating resin sheet 32, a V-phase insulating resin sheet 33, and a U-phase insulating resin sheet 34 are separated each other by a certain distance, a control lead 35 and a control input and output terminal 36 are provided between each of the U to W-phase insulating resin sheet in order to control the parallel connected IGBTs.

Peripheries of the IGBT and the diode, each conductor, and each insulating resin sheet are glued to the cooler 24 and encapsulated with insulating gel in a resin package 37 having the positive electrode terminal 38, the negative electrode terminal 39, the three-phase output terminal 40, and the control input and output terminal 36. Other configurations are the same as FIG. 10.

In the semiconductor device portion for electric power in the inverter apparatus of the embodiment, in addition to effects of the first to third embodiments, the control lead 35 from each of the IGBTs connected in parallel can be drawn in perpendicular to current of the main circuit and in the shortest distance, so that malfunction caused by a noise of control is eliminated and the reliability is increased.

In the embodiment, the semiconductor chips used per one phase of the upper side or lower side arm are divided uniformly to all current paths of each of the IGBTs and the diodes which are connected in parallel in a manner that a plurality of semiconductor chips are connected in parallel, so that current share of each of the IGBTs and the diodes becomes uniform and local overheat of semiconductor chips of the IGBTs and the diodes is never generated.

Furthermore, in the embodiment, since the insulating resin sheet is divided into each phase, the shear stress of the insulating resin sheet is decreased, which allows the reliability and the durability to be increased.

(Fifth Embodiment)

A fifth embodiment of the invention will be is described below referring to FIG. 11 and FIG. 14A to FIG. 14C.

Figure 14C:
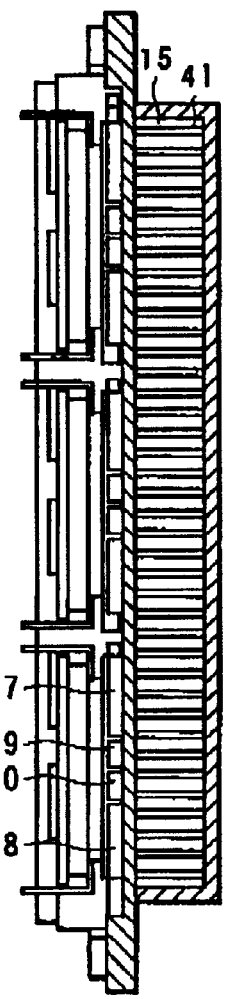
FIG. 14A to FIG. 14C shows a semiconductor device portion for electric power in an inverter apparatus according to a fifth embodiment of the invention.
Figure 14A:
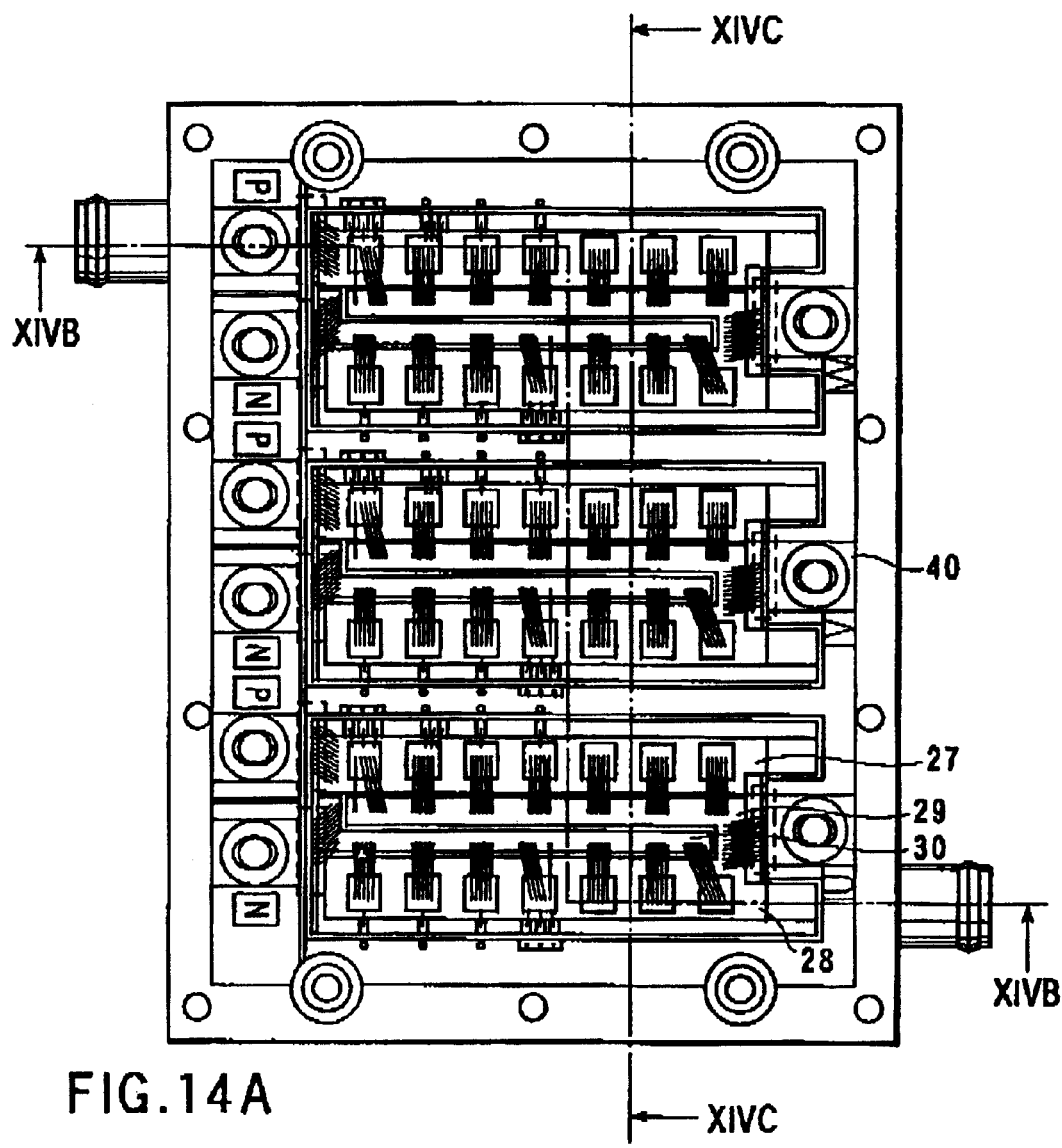
Figure 14B:
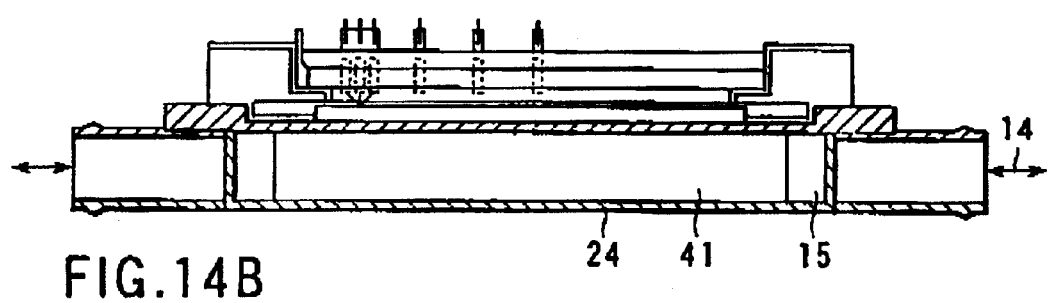

FIG. 14A is a plan view of a semiconductor device portion for electric power in an inverter apparatus according to the fifth embodiment of the invention, FIG. 14B is a sectional view taken along the line XIV-B—XIV-B of FIG. 14A, FIG. 14C is a sectional view taken along the line XIV-C—XIV-C of FIG. 14A. In the embodiment, the IGBT per one arm is four parallels and the diode per one arm is three parallels.

In FIG. 11, in the semiconductor device portion for electric power, the cooler 24 is a liquid cooled type cooler, an enlarged heat transfer surface 41 is provided in the channel 15 in which the coolant 14 of the liquid cooled type of cooler flows, and the enlarged heat transfer surface 41 is provided in parallel to the upper side arm conductor 27 and the lower arm conductor 28 to which the IGBT and the diode are bonded, the three-phase output conductor 29, and the negative electrode 30. Other configurations are the same as the first to fourth embodiments.

According to the embodiment, in addition to effects of the first to fourth embodiments, since the enlarged heat transfer surface 41 is provided in parallel to the conductor, thermal deformation of the cooler 24 in a longitudinal direction of the conductor cause by the heat cycle during the conducting period of the inverter apparatus can be restrained, the value of the shear stress generated in the insulating resin sheet can be decreased, the reliability and the durability of the insulating resin sheet can be further improved.

(Sixth Embodiment)

A sixth embodiment of the invention will be described below referring to FIG. 15A to FIG. 15C.

Figure 15C:
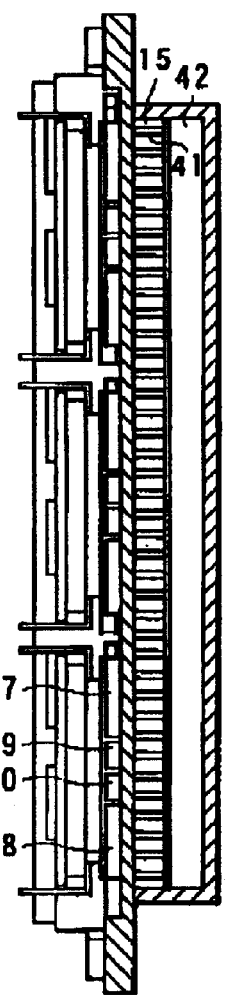
FIG. 15A to FIG. 15C shows a semiconductor device portion for electric power in an inverter apparatus according to a sixth embodiment of the invention.
Figure 15A:
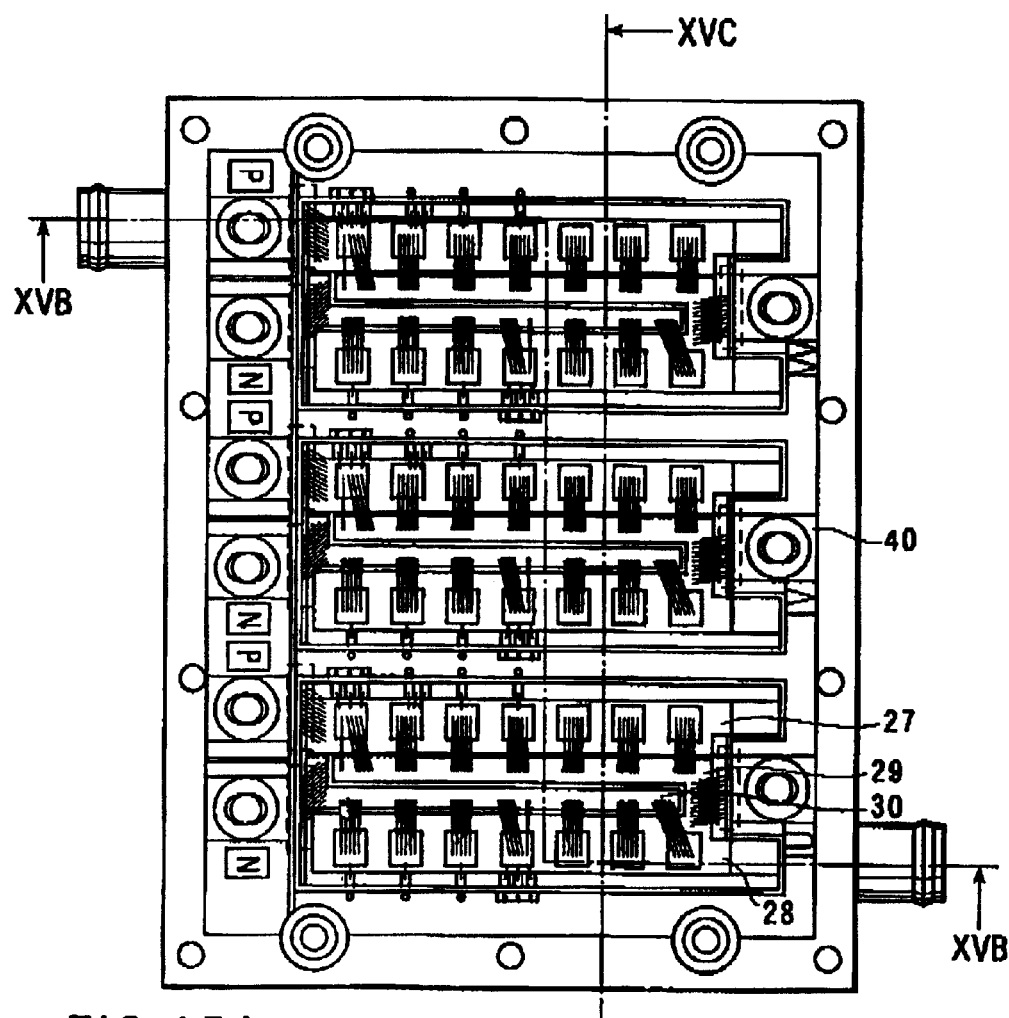
Figure 15B:
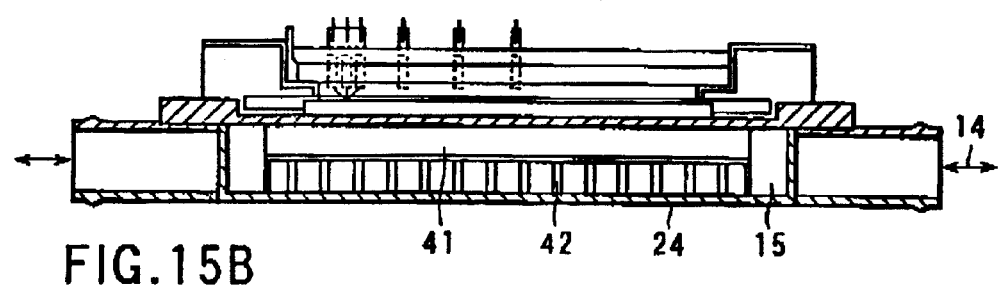

FIG. 15A is a plan view of a semiconductor device portion for electric power in an inverter apparatus according to the sixth embodiment of the invention, FIG. 15B is a sectional view taken along the line XV-B—XV-B of FIG. 15A, FIG. 15C is a sectional view taken along the line XV-C—XV-C of FIG. 15A. In the embodiment, the IGBT per one arm is four parallels and the diode per one arm is three parallels.

In FIG. 15A to FIG. 15C, in the semiconductor device portion for electric power, the cooler 24 is the liquid cooled type of cooler, an outside shape of the cooler 24 is the same as the fifth embodiment, and the cooler 24 has a two-stage arrangement of an upper and lower coolers.

That is to say, the cooler 24 includes an upper-stage cooler portion and a lover-stage cooler portion. In the upper-stage cooler portion, the enlarged heat transfer surface 41 is provided in the channel 15 in which the coolant 14 of the liquid cooled type of cooler flows, and the enlarged heat transfer surface 41 is provided in parallel to the upper side arm conductor 27 and the lower arm conductor 28 to which the IGBT and the diode are bonded, the three-phase output conductor 29, and the negative electrode 30.

In the lower-stage cooler portion, an enlarged heat transfer surface 42 is provided perpendicular to the enlarged heat transfer surface 41, the lower-stage cooler portion is the cooler which is opened to a periphery and in which the coolant does not flow. The number of plates of the enlarged heat transfer surface 42 is smaller than that of the enlarged heat transfer surface 41.

In the above-described arrangement, since the outside shape of the cooler 24 is the same as the fifth embodiment, heat dissipation area of the enlarged heat transfer surface 41 is half compared with the fifth embodiment, however, in case of the liquid cooled type of cooler, fin efficiency of the enlarged heat transfer surface 41 of the fifth embodiment is approximately 0.5 and the fin efficiency of the enlarged heat transfer surface 41 of the sixth embodiment is approximately 1, so that cooling capacity of the sixth embodiment is almost the same as that of the fifth embodiment. Other configurations are the same as the first to fifth embodiments.

According to the sixth embodiment, in addition to effects of the first to fifth embodiments, since the enlarged heat transfer surface 41 and the enlarged heat transfer surface 42 are orthogonal, the rigidity of the cooler is increased, the thermal deformation of the cooler 24 in a longitudinal direction of the conductor cause by the heat cycle during the conducting period of the inverter apparatus can be restrained better than the fifth embodiment, the value of the shear stress generated in the insulating resin sheet can be decreased, the reliability and the durability of the insulating resin sheet can be further improved.

(Seventh Embodiment)

A seventh embodiment of the invention will be described below referring to FIG. 16.

Figure 16:
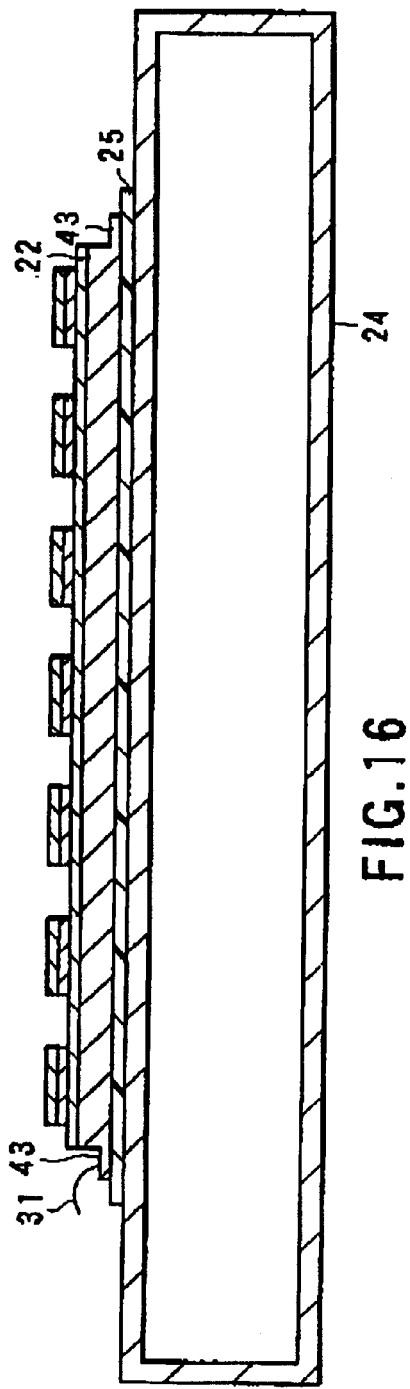
FIG. 16 is a partially sectional view showing a mounting structure of an inverter apparatus, particularly a semiconductor chip of an inside of a semiconductor device portion for electric power according to a seventh embodiment of the invention.

FIG. 16 is a partially sectional view showing a mounting structure of an inverter apparatus, particularly a semiconductor chip of an inside of a semiconductor device portion for electric power according to the seventh embodiment of the invention.

In FIG. 16, in the semiconductor device portion for electric power, an end portion of the conductor 22 is formed as a thin plate portion 43, the positive terminal 38, the negative terminal 39, the three-phase output terminal 40, and the wire bonding 31 for electric wiring are connected to the thin plate portion 43. Other configurations are the same as the first to sixth embodiments.

In the semiconductor device portion for electric power having the configuration shown in FIG. 16, the shear stress is generated in the insulating resin sheet 25 which glues the conductor 22 to the cooler 24 by the heat cycle during the conducting period of the inverter apparatus. The shear stress becomes the maximum at the end portion of the conductor 22.

Since the end portion of the conductor 22 is the thin plate portion 43, the rigidity of the end portion of the conductor 22 can be reduced, and the maximum shear stress of an epoxy resin sheet, which is generated in the end portion of the conductor 22 by the heat cycle during the conducting period of the inverter apparatus, can be reduced. When the thickness of the conductor 22 is 3 mm and a thickness of the thin plate portion 43 is 0.5 mm, the maximum shear stress of the epoxy resin sheet is reduced by about 28%.

According to the embodiment, in addition to effects of the first to sixth embodiments, the reliability and the durability of the insulating resin sheet can be further improved.

(Eighth Embodiment)

An eighth embodiment of the invention will be described below referring to FIG. 17.

Figure 17:
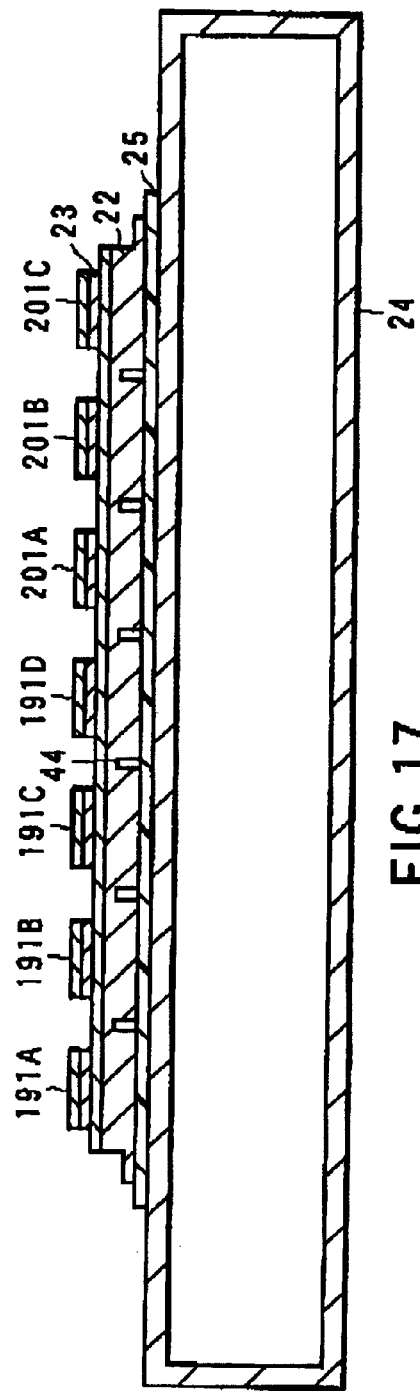
FIG. 17 is a partially sectional view showing a mounting structure of an inverter apparatus, particularly a semiconductor chip of an inside of a semiconductor device portion for electric power according to a eighth embodiment of the invention; and FIG. 18A to FIG. 18C shows a method of manufacturing an inverter apparatus according to a ninth embodiment of the invention.

FIG. 17 is a partially sectional view showing a mounting structure of an inverter apparatus, particularly a semiconductor chip of an inside of a semiconductor device portion for electric power according to the eighth embodiment of the invention.

In FIG. 17, in the semiconductor device portion for electric power, a slit 44 is provided in the conductor 22 between the IGBTs 191A to 191D and the diodes 201A to 201C are bonded, a surface where the slit 44 is provided is glued to the cooler 24 by the insulating resin sheet 25 containing ceramics. Other configurations are the same as the first to seventh embodiments.

In the semiconductor device portion for electric power having the configuration shown in FIG. 17, the shear stress is generated in the lower-melting or high-melting solder 23 which bonds the IGBTs 191A to 191D and the diodes 201A to 201C to the conductor 22 by the heat cycle during tile conducting period of the inverter apparatus.

In the embodiment, since the slit 44 is provided in the conductor 22, deformation easily occurs in a direction perpendicular to the longitudinal direction of the conductor 22, so that the thermal expansion in the longitudinal direction of the conductor 22 can be restrained, and the shear stress of the lower-melting or high-melting solder 23 can be reduced. When the thickness of the conductor 22 is 3 mm and a height of the slit 44 is 2.5 mm, the shear stress of the lower-melting or high-melting solder 23 is reduced by about 16%.

According to the embodiment, in addition to effects of the first to seventh embodiments, the reliability and the durability of the lower-melting or high-melting solder 23 can be further improved.

(Ninth Embodiment)

A ninth embodiment of the invention will be described below referring to FIG. 18A to FIG. 18C.

Figure 18A:
Figure 18B:
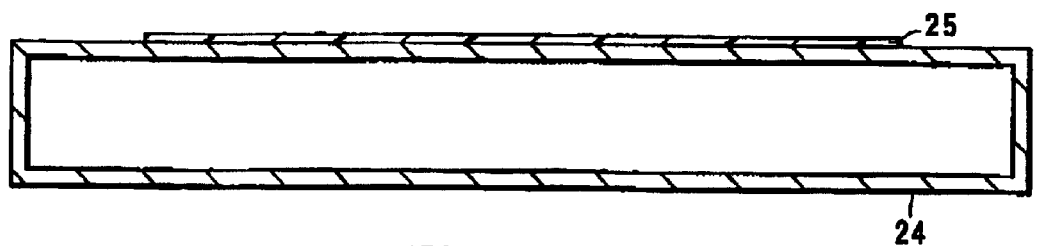
Figure 18C:
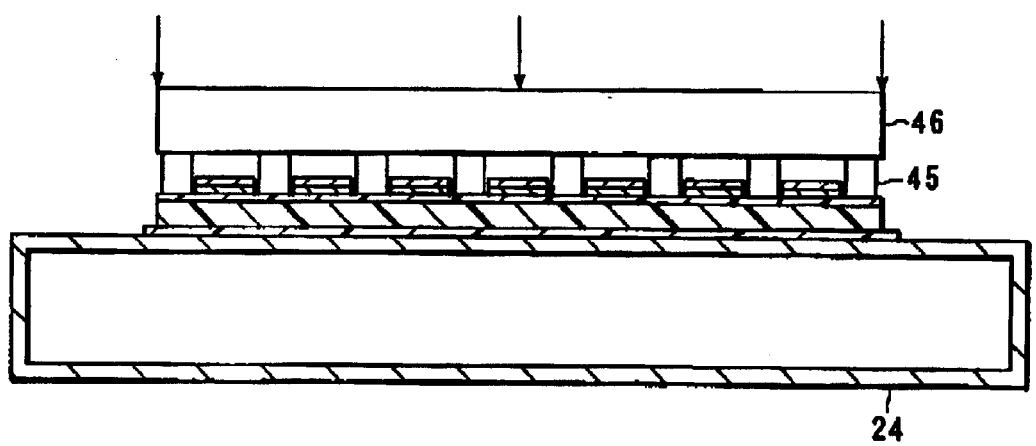

FIG. 18A to FIG. 18C shows a method of manufacturing an inverter apparatus according to a ninth embodiment of the invention.

In the semiconductor device portion for electric power, the IGBTs 191A to 191D and the diodes 201A to 201C are bonded are bonded to the conductor 22 by the low-melting solder 23 such as Sn/Pb or the high-melting solder 23 such as Sn/Pb/Cu as shown in FIG. 18A, the insulating resin sheet 25 is glued tentatively to the cooler 24 as shown in FIG. 18B. As shown in 18C, an elastic body 45 such as silicon rubber is arranged in a position where the IGBTs 191A to 191D and the diodes 201A to 201C are not bonded an order to pressurize uniformly, the conductor 22 is pressurized through a pressure plate 46, the conductor 22 and the cooler 24 are pressurized and heat-glued while the insulating resin sheet 25 is put between the conductor 22 and the cooler 24. A pressure temperature is, for example, from 160° C. to 170° C., pressurizing force is from about 20 kgf/cm$^2$ to about 30 kgf/cm$^2$.

In the semiconductor device portion for electric power of FIG. 18A to FIG. 18C, if the conductor 22 and the cooler 24 are glued at first by the insulating resin sheet 25, heating for long hours at a temperature more than a glass transition temperature or more of the insulating resin sheet 25 (for example, about 170° C.) is necessary when the IGBTs 191A to 191D and the diodes 201A to 201C are soldered, characteristics of the insulating resin sheet are deteriorated.

On the contrary, in the embodiment, since the above-described manufacturing method is employed, the characteristics of the insulating resin sheet are never deteriorated.

With respect to the solder, for example, a high-melting solder with Pb free such as a Sn/Ag/Cu solder can be also used.

As described above, according to the invention, an increase in the cooling efficiency of the inverter main circuit contributes to an increase in the current-carrying capacity, which allows the miniaturization of the inverter apparatus to be achieved. An increase in the reliability of the inverter main circuit and its semiconductor chips allows the reliability of the inverter apparatus to be increased.

What is claimed is:

1. An inverter apparatus comprising:
    a cooler;
    a conductor which is glued to the cooler through an insulating resin sheet containing ceramics and has a thickness of 1.5 mm or more and 5 mm or less; and
    a plurality of semiconductor chips which are bonded to the conductor through a bonding material and connected in parallel so as to constitute one arm of a three-phase inverter main circuit having a plurality of arms, said plurality of semiconductor chips having each size of 2 mm by 2 mm or more and 10 mm by 10 mm or less.

2. An inverter apparatus according to claim 1, wherein, in the conductor, a plating treatment is carried out on a surface on which the semiconductor chip is bonded, and a plating treatment is not carried out on a surface on which the cooler is glued by the insulating resin sheet containing ceramics.

3. An inverter apparatus according to claim 1, wherein the bonding material is solder having a thickness of 75 $\mu$m or more and 300 $\mu$m or less.

4. An inverter apparatus according to claim 1, wherein a thickness of the cooler is 3.3 times or more and 10 times or less of a thickness of the conductor.

5. An inverter apparatus according to claim 1, wherein the arm includes an upper side arm and a lower side arm which comprise a plurality of semiconductor chips connected in parallel respectively and the conductor includes first to fourth conductors,
    the first conductor which provides said plurality of semiconductor chips of the upper side arm is arranged in one line on the first conductor,
    the second conductor which provides said plurality of semiconductor chips of the lower side arm is arranged in one line on the second conductor,
    the third conductor which connects said plurality of semiconductor chips on the first conductor to a three-phase output electrode is arranged between the first conductor and the second conductor, and
    the fourth conductor which connects said plurality of semiconductor chips on the second conductor to an electrode of a negative electrode side is arranged.

6. An inverter apparatus according to claim 1, wherein the insulating resin sheet is divided into each phase of the three-phase inverter main circuit, the divided insulating sheets are separated from each other by a predetermined distance, and an input and output terminal of a lead to drive said plurality of semiconductor chips and a lead control for said plurality of semiconductor chips is provided between the respective insulating resin sheets.

7. An inverter apparatus according to claim 1, wherein the cooler comprises a liquid cooled type cooler having an enlarged heat transfer surface is provided in a channel where a coolant flows, and the enlarged heat transfer surface is provided in parallel to the conductor.

8. An inverter apparatus according to claim 1, wherein the cooler comprises a liquid cooled type cooler of a two-stage arrangement of an upper and lower coolers having an upper-stage cooler portion and a lower-stage cooler portion, the upper-stage cooler portion is functioned as a cooler in which the coolant cooling said plurality of semiconductor chips flows, the lower-stage cooler portion is functioned as a cooler which is opened to a periphery and in which the coolant does not flow, the upper-stage cooler portion having a first enlarged heat transfer surface is provided in the channel in which the coolant in the upper-stage cooler portion flows, the first enlarged heat transfer surface being arranged parallel to the conductor, and the lower-stage cooler portion having a second enlarged heat transfer surface is provided in a perpendicular direction to the first enlarged heat transfer surface in the lower-stage cooler portion.

9. An inverter apparatus according to claim 1, wherein the conductor has an end portion having a thin plate structure, wire bonding for electric wiring is connected to the end portion having the thin plate structure.

10. An inverter apparatus according to claim 1, wherein a slit is provided in the conductor between chips, a surface having in which the slit is provided is glued by the cooler and the insulating resin sheet.

11. A method of manufacturing an inverter apparatus in which a three-phase inverter main circuit has a plurality of arms each of which comprises a plurality of semiconductor chips connected in parallel, the method comprising:
    a step of bonding the plurality of semiconductor chips to a conductor through solder; and
    a step of pressurizing and heat-gluing the conductor to which the semiconductor chip is bonded to a cooler, while an insulating resin sheet containing ceramics is interposed between the conductor and the cooler.

12. A method of manufacturing an inverter apparatus according to claim 1, wherein a position where a plurality of semiconductor chips is not bonded is pressurized on the conductor.

* * * * *